United States Patent
Aoki

(10) Patent No.: US 6,448,772 B1
(45) Date of Patent: Sep. 10, 2002

(54) MAGNETIC FIELD ADJUSTING APPARATUS, MAGNETIC FIELD ADJUSTING METHOD AND RECORDING MEDIUM

(75) Inventor: Masaaki Aoki, Takatsuki (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 0 days.

(21) Appl. No.: 09/969,784

(22) Filed: Oct. 4, 2001

(30) Foreign Application Priority Data

Oct. 6, 2000 (JP) ......................................... 2000-307608

(51) Int. Cl.[7] ................................................. G01V 3/00
(52) U.S. Cl. ........................ 324/307; 324/309; 324/318
(58) Field of Search ................................ 324/307, 309, 324/318, 320, 319, 322; 335/299

(56) References Cited

U.S. PATENT DOCUMENTS

| | | | |
|---|---|---|---|
| 4,698,611 A | 10/1987 | Vermilyea | |
| 4,771,244 A | 9/1988 | Vermilyea | |
| 5,431,165 A | * 7/1995 | Sellers | ........................ 600/422 |
| 6,252,405 B1 | * 6/2001 | Watkins et al. | ............. 324/319 |

FOREIGN PATENT DOCUMENTS

| | | |
|---|---|---|
| JP | 2602513 | 1/1997 |
| JP | 9-56692 | 3/1997 |

* cited by examiner

*Primary Examiner*—Edward Lefkowitz
*Assistant Examiner*—Brij B. Shrivastav
(74) *Attorney, Agent, or Firm*—Armstrong, Westerman & Hattori, LLP

(57) ABSTRACT

A magnetic field adjusting apparatus calculates a location and the number of magnetic field adjusting pieces to be disposed, by means of a linear programming. A value corresponding to an expected magnetic field uniformity is calculated bed on the location and the number of adjusting pieces. The location and the number of the adjusting pieces for the value corresponding to the expected magnetic field uniformity not grater than a predetermined value are displayed in a display portion. The worker disposes the adjusting piece on a magnetic field generator based on the display. If the value corresponding too the expected magnetic field uniformity is greater than the predetermined value, a value corresponding to an expected magnetic field uniformity is further calculated by using a direct search. A location and the number of the adjusting pieces that minimize the value corresponding to the expected magnetic field uniformity are selected and displayed in the display portion. The worker disposes the adjusting piece on the generator based on the display.

13 Claims, 8 Drawing Sheets

FIG. 6A

```
<<< Output Summary >>>

Method : LP
Measured homogeneity in PPM    : 45.1
Calculated PPM (LP Unrounded)  : 19.0
Calculated PPM (LP Rounded)    : 35.8
```

FIG. 6B

| Location | U1 | U2 | U3 | U4 | U5 | U6 | U7 | L1 | L2 | L3 | L4 | L5 | L6 | L7 | |
|---|---|---|---|---|---|---|---|---|---|---|---|---|---|---|---|
| Shim (mm) | 4 | 4 | 7 | 7 | 7 | 12 | 12 | 4 | 4 | 7 | 7 | 7 | 12 | 12 | SUM |
| Current | 0 | 0 | 0 | 0 | 0 | 0 | 0 | 0 | 0 | 0 | 0 | 0 | 0 | 0 | 0 |
| Delta | 0 | 0 | 0 | 1 | 1 | 0 | 0 | 0 | 0 | 0 | 0 | 0 | 0 | 0 | 2 |
| Total | 0 | 0 | 0 | 1 | 1 | 0 | 0 | 0 | 0 | 0 | 0 | 0 | 0 | 0 | 2 |

FIG. 6C

Display Shim Direction and Shim Location     * UPPER DELTA *
INDEX                    Rotation (Degrees)

| (No.) | 0 | 30 | 60 | 90 | 120 | 150 | 180 | 210 | 240 | 270 | 300 | 330 |
|---|---|---|---|---|---|---|---|---|---|---|---|---|
| U1 | 0.00 | 0.00 | 0.00 | 0.00 | 0.00 | 0.00 | 0.00 | 0.00 | 0.00 | 0.00 | -0.18 | 0.00 |
| U2 | 0.00 | 0.00 | 0.00 | 0.00 | 0.00 | 0.00 | 0.00 | 0.00 | -0.06 | 0.00 | -0.11 | -0.01 |
| U3 | 0.00 | 0.11 | 0.20 | 0.23 | 0.38 | 0.00 | 0.00 | 0.00 | 0.00 | -0.03 | 0.00 | 0.00 |
| U4 | 0.00 | 0.00 | 0.00 | 0.00 | 0.00 | 0.00 | 0.00 | -0.25 | -0.25 | -0.11 | -0.57 | 0.00 |
| U5 | 0.00 | 0.00 | 0.00 | 0.00 | 0.00 | 0.00 | 0.00 | 0.00 | 0.00 | -0.72 | 0.00 | 0.00 |
| U6 | 0.00 | 0.00 | 0.00 | 0.00 | 0.00 | 0.00 | 0.00 | 0.00 | 0.00 | 0.00 | 0.00 | 0.00 |
| U7 | 0.00 | 0.00 | 0.00 | 0.00 | 0.00 | 0.00 | 0.00 | 0.00 | 0.00 | 0.00 | 0.00 | 0.00 |

FIG. 6D

Display Shim Direction and Shim Location     * LOWER DELTA *
INDEX                    Rotation (Degrees)

| (No.) | 0 | 30 | 60 | 90 | 120 | 150 | 180 | 210 | 240 | 270 | 300 | 330 |
|---|---|---|---|---|---|---|---|---|---|---|---|---|
| L1 | 0.00 | 0.00 | 0.00 | 0.00 | 0.00 | 0.00 | 0.00 | 0.00 | 0.00 | 0.00 | 0.00 | 0.00 |
| L2 | 0.00 | 0.00 | 0.00 | 0.00 | 0.00 | 0.00 | 0.00 | 0.02 | 0.15 | 0.02 | 0.00 | 0.00 |
| L3 | 0.39 | 0.20 | 0.20 | 0.06 | 0.00 | 0.00 | 0.38 | 0.00 | 0.00 | 0.19 | 0.41 | 0.00 |
| L4 | 0.00 | 0.07 | 0.00 | 0.00 | 0.00 | 0.00 | 0.00 | 0.00 | 0.00 | 0.00 | 0.05 | 0.00 |
| L5 | 0.00 | 0.00 | 0.00 | 0.00 | 0.00 | 0.00 | 0.00 | 0.00 | 0.00 | 0.00 | 0.00 | 0.00 |
| L6 | 0.00 | 0.00 | 0.00 | 0.00 | -0.41 | 0.00 | 0.00 | 0.00 | 0.00 | 0.00 | 0.00 | 0.00 |
| L7 | 0.00 | 0.00 | 0.00 | 0.00 | 0.00 | 0.00 | 0.00 | 0.00 | 0.00 | 0.00 | 0.00 | 0.00 |

FIG. 7A

<<< Output Summary >>>

Method : DS
Measured homogeneity in PPM   :  45.1
Calculated PPM (DS added)     :  41.4

FIG. 7B

| Location | U1 | U2 | U3 | U4 | U5 | U6 | U7 | L1 | L2 | L3 | L4 | L5 | L6 | L7 | |
|---|---|---|---|---|---|---|---|---|---|---|---|---|---|---|---|
| Shim (mm) | 4 | 4 | 7 | 7 | 7 | 12 | 12 | 4 | 4 | 7 | 7 | 7 | 12 | 12 | SUM |
| Current | 0 | 0 | 0 | 0 | 0 | 0 | 0 | 0 | 0 | 0 | 0 | 0 | 0 | 0 | 0 |
| Delta | 1 | 0 | 1 | 0 | 3 | 0 | 0 | 0 | 2 | 0 | 1 | 1 | 1 | 0 | 10 |
| Total | 1 | 0 | 1 | 0 | 3 | 0 | 0 | 0 | 2 | 0 | 1 | 1 | 1 | 0 | 10 |

FIG. 7C

Display Shim Direction and Shim Location     \*\*\* UPPER DELTA \*\*\*
INDEX                            Rotation (Degrees)

| (No.) | 0 | 30 | 60 | 90 | 120 | 150 | 180 | 210 | 240 | 270 | 300 | 330 |
|---|---|---|---|---|---|---|---|---|---|---|---|---|
| U1 | 0.00 | 0.00 | 0.00 | 0.00 | 0.00 | 0.00 | 0.00 | 0.00 | 0.00 | 0.00 | 0.00 | -1.00 |
| U2 | 0.00 | 0.00 | 0.00 | 0.00 | 0.00 | 0.00 | 0.00 | 0.00 | 0.00 | 0.00 | 0.00 | 0.00 |
| U3 | 0.00 | 0.00 | 0.00 | 0.00 | 0.00 | 0.00 | 0.00 | 0.00 | 0.00 | -1.00 | 0.00 | 0.00 |
| U4 | 0.00 | 0.00 | 0.00 | 0.00 | 0.00 | 0.00 | 0.00 | 0.00 | 0.00 | 0.00 | 0.00 | 0.00 |
| U5 | 0.00 | 0.00 | 0.00 | 0.00 | 0.00 | 0.00 | 0.00 | -1.00 | 0.00 | 0.00 | -1.00 | -1.00 |
| U6 | 0.00 | 0.00 | 0.00 | 0.00 | 0.00 | 0.00 | 0.00 | 0.00 | 0.00 | 0.00 | 0.00 | 0.00 |
| U7 | 0.00 | 0.00 | 0.00 | 0.00 | 0.00 | 0.00 | 0.00 | 0.00 | 0.00 | 0.00 | 0.00 | 0.00 |

FIG. 7D

Display Shim Direction and Shim Location     \*\*\* LOWER DELTA \*\*\*
INDEX                            Rotation (Degrees)

| (No.) | 0 | 30 | 60 | 90 | 120 | 150 | 180 | 210 | 240 | 270 | 300 | 330 |
|---|---|---|---|---|---|---|---|---|---|---|---|---|
| L1 | 0.00 | 0.00 | 0.00 | 0.00 | 0.00 | 0.00 | 0.00 | 0.00 | 0.00 | 0.00 | 0.00 | 0.00 |
| L2 | 0.00 | 0.00 | 0.00 | 0.00 | 0.00 | 0.00 | 0.00 | 1.00 | 0.00 | 0.00 | 1.00 | 0.00 |
| L3 | 0.00 | 0.00 | 0.00 | 0.00 | 0.00 | 0.00 | 0.00 | 0.00 | 0.00 | 0.00 | 0.00 | 0.00 |
| L4 | 0.00 | 1.00 | 0.00 | 0.00 | 0.00 | 0.00 | 0.00 | 0.00 | 0.00 | 0.00 | 0.00 | 0.00 |
| L5 | 0.00 | 0.00 | 0.00 | 0.00 | 0.00 | 0.00 | 0.00 | 0.00 | 0.00 | 0.00 | 1.00 | 0.00 |
| L6 | 0.00 | 0.00 | 0.00 | 0.00 | 0.00 | 0.00 | 0.00 | 0.00 | -1.00 | 0.00 | 0.00 | 0.00 |
| L7 | 0.00 | 0.00 | 0.00 | 0.00 | 0.00 | 0.00 | 0.00 | 0.00 | 0.00 | 0.00 | 0.00 | 0.00 |

FIG. 8A

```
<<< Output Summary >>>

Method : LP+DS
Measured homogeneity in PPM   :  45.1
Calculated PPM (LP Unrounded) :  19.0
Calculated PPM (LP Rounded)   :  35.8
Calculated PPM (DS added)     :  26.1
```

FIG. 8B

| Location | U1 | U2 | U3 | U4 | U5 | U6 | U7 | L1 | L2 | L3 | L4 | L5 | L6 | L7 | |
|---|---|---|---|---|---|---|---|---|---|---|---|---|---|---|---|
| Shim (mm) | 4 | 4 | 7 | 7 | 7 | 12 | 12 | 4 | 4 | 7 | 7 | 7 | 12 | 12 | SUM |
| Current | 0 | 0 | 0 | 0 | 0 | 0 | 0 | 0 | 0 | 0 | 0 | 0 | 0 | 0 | 0 |
| Delta | 0 | 1 | 0 | 1 | 1 | 0 | 0 | 0 | 2 | 0 | 1 | 0 | 1 | 0 | 7 |
| Total | 0 | 1 | 0 | 1 | 1 | 0 | 0 | 0 | 2 | 0 | 1 | 0 | 1 | 0 | 7 |

FIG. 8C

Display Shim Direction and Shim Location    \*\*\* UPPER DELTA \*\*\*

| INDEX (No.) | 0 | 30 | 60 | 90 | 120 | 150 | 180 | 210 | 240 | 270 | 300 | 330 |
|---|---|---|---|---|---|---|---|---|---|---|---|---|
| U1 | 0.00 | 0.00 | 0.00 | 0.00 | 0.00 | 0.00 | 0.00 | 0.00 | 0.00 | 0.00 | -0.18 | 0.00 |
| U2 | 0.00 | 0.00 | 0.00 | 0.00 | 0.00 | 0.00 | 0.00 | 0.00 | -0.06 | -1.00 | -0.11 | -0.01 |
| U3 | 0.00 | 0.11 | 0.20 | 0.23 | 0.38 | 0.00 | 0.00 | 0.00 | 0.00 | -0.03 | 0.00 | 0.00 |
| U4 | 0.00 | 0.00 | 0.00 | 0.00 | 0.00 | 0.00 | 0.00 | -0.25 | -0.25 | -0.11 | -0.57 | 0.00 |
| U5 | 0.00 | 0.00 | 0.00 | 0.00 | 0.00 | 0.00 | 0.00 | 0.00 | 0.00 | -0.72 | 0.00 | 0.00 |
| U6 | 0.00 | 0.00 | 0.00 | 0.00 | 0.00 | 0.00 | 0.00 | 0.00 | 0.00 | 0.00 | 0.00 | 0.00 |
| U7 | 0.00 | 0.00 | 0.00 | 0.00 | 0.00 | 0.00 | 0.00 | 0.00 | 0.00 | 0.00 | 0.00 | 0.00 |

FIG. 8D

Display Shim Direction and Shim Location    \*\*\* LOWER DELTA \*\*\*

| INDEX (No.) | 0 | 30 | 60 | 90 | 120 | 150 | 180 | 210 | 240 | 270 | 300 | 330 |
|---|---|---|---|---|---|---|---|---|---|---|---|---|
| L1 | 0.00 | 0.00 | 0.00 | 0.00 | 0.00 | 0.00 | 0.00 | 0.00 | 0.00 | 0.00 | 0.00 | 0.00 |
| L2 | 0.00 | 0.00 | 0.00 | 0.00 | 0.00 | 0.00 | 0.00 | 1.02 | 0.15 | 0.02 | 1.00 | 0.00 |
| L3 | 0.39 | 0.20 | 0.20 | 0.06 | 0.00 | 0.00 | 0.38 | 0.00 | 0.00 | 0.19 | 0.41 | 0.00 |
| L4 | 0.00 | 1.07 | 0.00 | 0.00 | 0.00 | 0.00 | 0.00 | 0.00 | 0.00 | 0.00 | 0.05 | 0.00 |
| L5 | 0.00 | 0.00 | 0.00 | 0.00 | 0.00 | 0.00 | 0.00 | 0.00 | 0.00 | 0.00 | 0.00 | 0.00 |
| L6 | 0.00 | 0.00 | 0.00 | 0.00 | -0.41 | 0.00 | 0.00 | 0.00 | -1.00 | 0.00 | 0.00 | 0.00 |
| L7 | 0.00 | 0.00 | 0.00 | 0.00 | 0.00 | 0.00 | 0.00 | 0.00 | 0.00 | 0.00 | 0.00 | 0.00 |

MAGNETIC FIELD ADJUSTING APPARATUS, MAGNETIC FIELD ADJUSTING METHOD AND RECORDING MEDIUM

BACKGROUND OF THE INVENTION

1. Field of the invention

The present invention relates to a magnetic field adjusting apparatus, a magnetic field adjusting method and a recording medium. More specifically, the present invention relates to a magnetic field adjusting apparatus, a magnetic field adjusting method and a recording medium containing a magnetic field adjusting program, for a magnetic field generator used in an MRI (magnetic resonance imaging) apparatus and so on.

2. Description of the Related Art

A magnetic field uniformity required of a magnetic circuit used in an MRI apparatus is very rigid (30 pmm for example). At a time of shipment from factory, an adjustment is performed to the magnetic field, so the magnetic field uniformity is assured, but vibration during transportation, environmental change at a place of installation and so on often deteriorate the magnetic field uniformity (to 50 pmm approx. for example). Therefore, when the MRI apparatus is delivered to the place of installation, the magnetic field uniformity is readjusted by using a movable yoke and an adjustment bolt. The magnetic field uniformity can be obtained by the formula (Magnetic field strength maximum value—Magnetic field strength minimum value)$\times 10^6$/(Center magnetic field strength or Average magnetic field strength), and a smaller value indicates a higher magnetic field uniformity.

If the magnetic field uniformity cannot be brought back within a predetermined range in this adjustment, a final adjustment must be performed, in which magnetic field adjusting pieces each made of a small magnet in the form of e.g. a rectangular parallelepiped is bonded onto a silicon steel plate on a pole piece.

For this process, Japanese Patent Laid-Open No. 9-56692 discloses a technique of using a linear programming and so on for calculating the locations and the number of the magnetic field adjusting pieces to be bonded onto the pole piece.

However, no disclosure has been made for the specifics of the process, and the magnetic field adjustment is not easy.

SUMMARY OF THE INVENTION

It is therefore a primary object of the present invention to provide a magnetic field adjusting apparatus, a magnetic field adjusting method and a recording medium that make possible easy and accurate magnetic field adjustment.

According to an aspect of the present invention, there is provided a magnetic field adjusting apparatus for adjusting a magnetic field of a space in a magnetic field generator including a pair of plate yokes opposed to each other and a permanent magnet disposed on an opposed surface of each plate yoke. The apparatus comprises: means for measuring a magnetic field strength at a predetermined position in the space; means for storing in memory an amount of change in the magnetic field caused by placement of a magnetic field adjusting piece at a predetermined location of the magnetic field generator; means for inputting a target value for a magnetic field uniformity; means for calculating a location and the number of the magnetic field adjusting pieces based on the magnetic field strength, the amount of change in the magnetic field and the target value; means for calculating an expected magnetic field uniformity based on the location and the number of the magnetic field adjusting pieces; and means for outputting the location and the number of the magnetic field adjusting pieces if the expected magnetic field uniformity is not greater than a predetermined value.

According to another aspect of the present invention, there is provided a magnetic field adjusting method for adjusting a magnetic field of a space in a magnetic field generator including a pair of plate yokes opposed to each other and a permanent magnet disposed on an opposed surface of each plate yoke. The method comprises: a step (a) of measuring a magnetic field strength at a predetermined position in the space; a step (b) of storing in memory an amount of change in the magnetic field caused by placement of a magnetic field adjusting piece at a predetermined location of the magnetic field generator; a step (c) of inputting a target value for a magnetic field uniformity; a step (d) of calculating a location and the number of the magnetic field adjusting pieces based on the magnetic field strength, the amount of change in the magnetic field and the target value; a step (e) of calculating an expected magnetic field uniformity based on the location and the number of the magnetic field adjusting pieces; a step (f) of outputting the location and the number of the magnetic field adjusting pieces if the expected magnetic field uniformity is not greater than a predetermined value; and a step (g) of disposing the magnetic field adjusting piece on the magnetic field generator based on the outputted location and the number of the magnetic field adjusting pieces.

According to still another aspect of the present invention, there is provided a computer-readable recording medium containing a program for adjusting a magnetic field of a space in a magnetic field generator including a pair of plate yokes opposed to each other and a permanent magnet disposed on an opposed surface of each plate yoke. The program is executable by a computer and comprises: a step of inputting a magnetic field strength at a predetermined position in the space; a step of storing in memory an amount of change in the magnetic field caused by placement of a magnetic field adjusting piece at a predetermined location of the magnetic field generator; a step of inputting a target value for a magnetic field uniformity; a step of calculating a location and the number of the magnetic field adjusting pieces based on the magnetic field strength, the amount of change in the magnetic field and the target value; a step of calculating an expected magnetic field uniformity based on the location and the number of the magnetic field adjusting pieces; and a step of outputting the location and the number of the magnetic field adjusting pieces if the expected magnetic field uniformity is not greater than a predetermined value.

According to the present invention, a linear programming method for example is employed in the calculation of the location(s) and the number of the magnetic field adjusting pieces based on the magnetic field strength in the space of the magnetic field generator, the amount of change in the magnetic field caused by the placement of the magnetic field adjusting piece at the predetermined location of the magnetic field generator and the target value for the magnetic field uniformity. The expected magnetic field uniformity is calculated based on the locations and the number of the magnetic field adjusting pieces. The locations and the number of the magnetic field adjusting pieces for the expected magnetic field uniformity not greater than a predetermined value are outputted. The worker should simply dispose the magnetic field adjusting pieces based on the output, and therefore, the magnetic field can be adjusted easily and accurately in accordance with the inputted target value, with a small number of the magnetic field adjusting pieces.

Preferably, a check is made if the number of the magnetic field adjusting pieces given by the calculation is not greater than an upper limit or not. Then, the expected magnetic field uniformity expected for the number of the magnetic field adjusting pieces not greater than the upper limit is compared with the predetermined value. If the expected magnetic field uniformity (dispersion of magnetic field strength) is not greater than the predetermined value, the corresponding locations and the number of the magnetic field adjusting pieces are outputted. As described, by setting an upper limit to the number of the magnetic field adjusting pieces to be disposed, the magnetic field can be adjusted with a fewer magnetic field adjusting pieces, without interfering with a gradient coil.

Further, preferably, if the expected magnetic field uniformity is greater than the predetermined value, an expected magnetic field uniformity expected by further placement of the magnetic field adjusting piece at a predetermined location of the magnetic field generator is calculated, for each placement of the magnetic field adjusting piece. Then, a location and the number of the magnetic field adjusting pieces that minimize the expected magnetic field uniformity are outputted, and placement of the magnetic field adjusting piece is made on the magnetic field generator based on the outputted location and the number of the magnetic field adjusting pieces.

As described, if the expected magnetic field uniformity is greater than the predetermined value, an expected magnetic field uniformity is further calculated by using for example a direct search method, and the locations and the number of the magnetic field adjusting pieces that minimize the expected magnetic field uniformity are selected and outputted. Therefore, worker can adjust the magnetic field more accurately by disposing the magnetic field adjusting pieces onto the magnetic field generator based on the output.

According to another aspect of the present invention, there is provided a magnetic field adjusting apparatus for adjusting a magnetic field of a space in a magnetic field generator including a pair of plate yokes opposed to each other and a permanent magnet disposed on an opposed surface of each plate yoke. The apparatus comprises: means for measuring a magnetic field strength at a predetermined position in the space; means for storing in memory an amount of change in the magnetic field caused by placement of a magnetic field adjusting piece at a predetermined location of the magnetic field generator; means for calculating an expected magnetic field uniformity expected by placement of the magnetic field adjusting piece at a predetermined location of the magnetic field generator, based on the magnetic field strength and the amount of change in the magnetic field, for each placement of the magnetic field adjusting piece; and means for outputting a location and the number of the magnetic field adjusting pieces that minimize the expected magnetic field uniformity.

According to still another aspect of the present invention, there is provided a magnetic field adjusting method for adjusting a magnetic field of a space in a magnetic field generator including a pair of plate yokes opposed to each other and a permanent magnet disposed on an opposed surface of each plate yoke. The method comprises: a step (a) of measuring a magnetic field strength at a predetermined position in the space; a step (b) of storing in memory an amount of change in the magnetic field caused by placement of a magnetic field adjusting piece at a predetermined location of the magnetic field generator; a step (c) of calculating an expected magnetic field uniformity expected by placement of the magnetic field adjusting piece at a predetermined location of the magnetic field generator, based on the magnetic field strength and the amount of change in the magnetic field, for each placement of the magnetic field adjusting piece; a step (d) of outputting a location and the number of the magnetic field adjusting pieces that minimize the expected magnetic field uniformity; and a step (e) of disposing the magnetic field adjusting piece on the magnetic field generator based on the outputted location and the number of the magnetic field adjusting pieces.

According to still another aspect of the present invention, there is provided a computer-readable recording medium containing a program for adjusting a magnetic field of a space in a magnetic field generator including a pair of plate yokes opposed to each other and a permanent magnet disposed on an opposed surface of each plate yoke. The program is executable by a computer and comprises: a step of inputting a magnetic field strength at a predetermined position in the space; a step of storing in memory an amount of change in the magnetic field caused by placement of a magnetic field adjusting piece at a predetermined location of the magnetic field generator; a step of calculating an expected magnetic field uniformity expected by placement of the magnetic field adjusting piece at a predetermined location of the magnetic field generator, based on the magnetic field strength and the amount of change in the magnetic field, for each placement of the magnetic field adjusting piece; and a step of outputting a location and the number of the magnetic field adjusting pieces that minimize the expected magnetic field uniformity.

According to the present invention, the expected magnetic field uniformity is calculated by means of the direct search for example, based on the magnetic field strength in the space of the magnetic field generator and the amount of change in the magnetic field caused by the placement of the magnetic field adjusting piece at the predetermined location of the magnetic field generator, for each placement of the magnetic field adjusting piece. Then, the location(s) and the number of the magnetic field adjusting pieces that minimize the expected magnetic field uniformity are selected and outputted. The worker should simply dispose the magnetic field adjusting pieces onto the magnetic field generator based on the output, and thus the magnetic field can be adjusted easily and accurately.

Preferably, checking is made if the number of the magnetic field adjusting pieces placed on the magnetic field generator for the calculation of the expected magnetic field uniformity is not greater than an upper limit or not. If the number of the magnetic field adjusting pieces is not greater than the upper limit, then the locations and the number of the magnetic field adjusting pieces that minimize the expected magnetic field uniformity are outputted. By setting an upper limit to the number of the magnetic field adjusting pieces to be disposed, the magnetic field can be adjusted with a fewer magnetic field adjusting pieces, without interfering with a gradient coil.

In the above invention, preferably, a silicon steel plate is provided on the permanent magnet, and placement of the magnetic field adjusting piece is made on the silicon steel plate. With this arrangement, the amount of change in the magnetic field per magnetic field adjusting piece can be set to a small value, making easy to perform fine adjustment to the magnetic field.

Further, preferably, the magnetic field adjusting piece is provided by a magnet. This arrangement allows the magnetic field adjustment to be made in both the positive and the negative directions, making possible to perform the magnetic field adjustment more flexibly.

The above object, other objects, characteristics, aspects and advantages of the present invention will become clearer from the following description of an embodiment to be presented with reference to the accompanying drawings.

BRIEF DESCRIPTION OF THE DRAWINGS

FIG. 6A–FIG. 6D are diagrams showing display examples in a calculation according to a linear programming;

FIG. 7A–FIG. 7D are diagrams showing display examples in a calculation according to a direct search; and FIG. 8A–FIG. 8D are diagrams showing display examples in a calculation according to a combination of the linear programming and the direct search.

DETAILED DESCRIPTION OF THE PREFERRED EMBODIMENTS

Now, a preferred embodiment of the present invention will be described with reference to the drawings.

Figure 1:
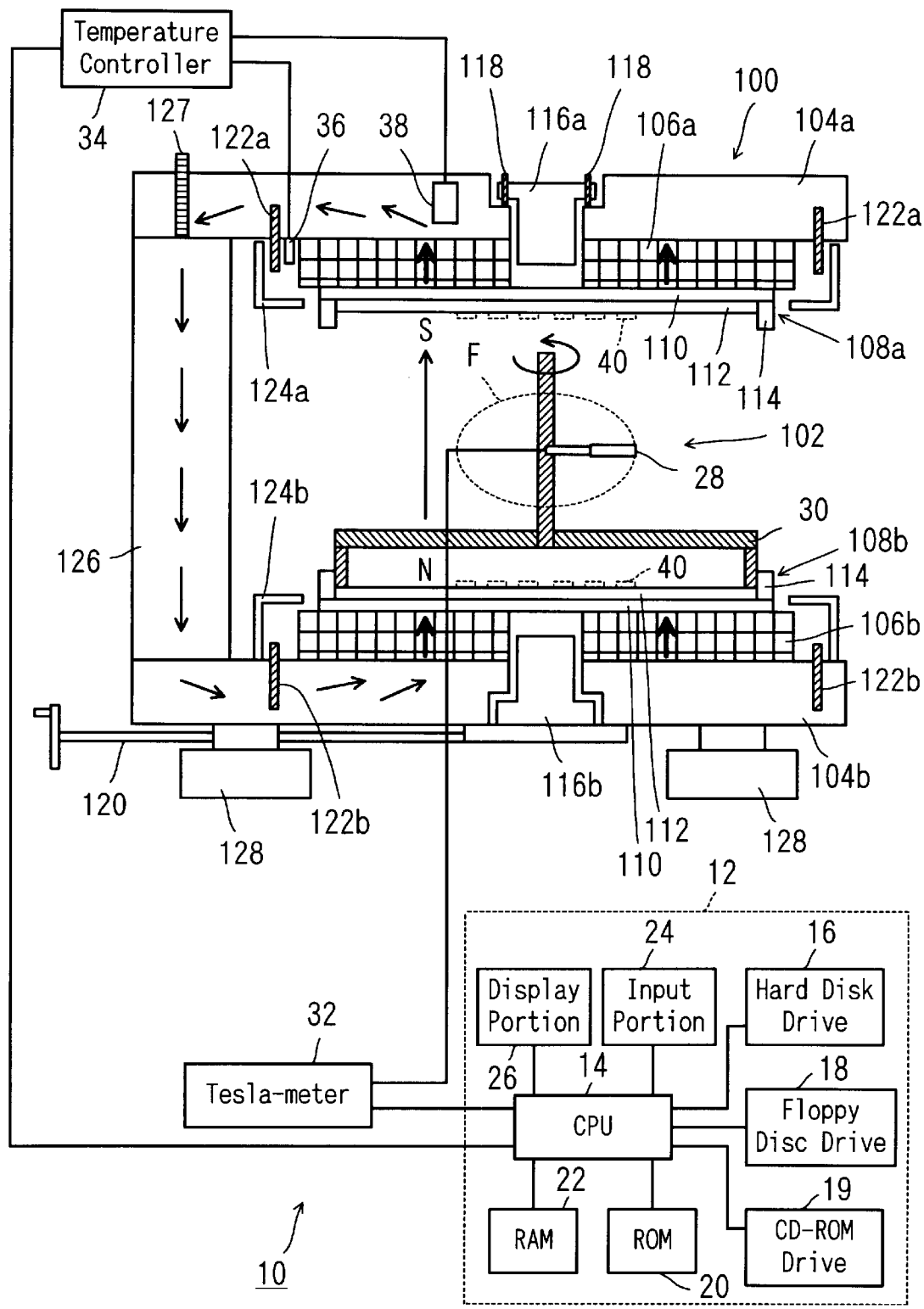
FIG. 1 is a schematic diagram showing an embodiment of the present invention.

Referring to FIG. 1, a magnetic field adjusting apparatus 10 as an embodiment of the present invention is used for adjusting a magnetic field of a space 102 in a magnetic field generator 100 for e.g. an MRI.

The magnetic field generator 100 includes a pair of plate yokes 104a, 104b opposed to each other, with the space 102 in between.

The plate yokes 104a, 104b have respective surfaces facing each other, on which permanent magnet groups 106a, 106b are disposed respectively. The permanent magnet groups 106a, 106b have respective surfaces facing each other, on which pole pieces 108a, 108b are fixed respectively.

Each of the permanent magnet groups 106a, 106b is made of a R-Fe-B sintered magnet for example, and is structured for example by three tiers of unit magnets such as cubes having a side length of 50 mm. The R-Fe-B sintered magnet is disclosed in U.S. Pat. No. 4,770,723.

The pole piece 108a includes a disc-like base plate 110 made for example of iron, disposed on a main surface of the permanent magnet groups 106a. The base plate 110 has a main surface provided with a silicon steel plate 112 for prevention of eddy current. The silicon steel plate 112 is bonded on the base plate 110 with an adhesive. The base plate 110 has a circumferential edge portion formed with an annular projection 114 made for example of iron, in order to increase magnetic field strength at the circumferential edge portion. The annular projection 114 forms an inner recess, where a gradient coil (not illustrated) is disposed. Essentially the same arrangement is provided to the pole piece 108b.

Further, movable yokes 116a, 116b for magnetic field adjustment are disposed at the center of respective plate yokes 104a, 104b. Vertical position of the movable yoke 116a is adjusted by bolts 118. Vertical position of the movable yoke 116b is adjusted by operating an extension rod 120. Further, adjusting bolts 122a, 122b as well as magnet covers 124a, 124b are provided at the respective opposed surfaces of the plate yokes 104a, 104b, outside the permanent magnet groups 106a, 106b. The plate yokes 104a, 104b are magnetically connected together by a column yoke 126. A gap adjusting bolt 127 is threaded from a top surface of the plate yoke 104a, for adjusting a gap between the plate yoke 104a and the column yoke 126. The movable yokes 116a, 116b, the adjusting bolts 122a, 122b, and the gap adjusting bolt 127 offer mechanical shimming for a coarse adjustment of the magnetic field.

A bottom surface of the plate yoke 104b is provided with legs 128.

Now, the magnetic field adjusting apparatus 10 used for adjusting the magnetic field in the space 102 of the magnetic field generator 100 as described above comprises a computer 12 such as a personal computer. The computer 12 includes: a CPU 14 for controlling the operation of the computer 12 and thus of the magnetic field adjusting apparatus 10; a hard disk drive 16; a floppy disk drive 18; a CD-ROM drive 19; a ROM 20 which stores programs, data and so on; a RAM 22 for temporary storage of calculation data and son; an input portion 24 provided by a keyboard, a mouse and so on; and a display portion 26 provided by a display and so on. The hard disc drive 16 operates a hard disc, which stores programs and so on for the computer 12 to perform an operation illustrated in FIG. 3 through FIG. 5.

The magnetic field adjusting apparatus 10 further comprises a probe (NMR element) 28 placed in a uniform space F of the magnetic field generator 100. The "uniform spaces" herein is a magnetic field space having a magnetic field uniformity not greater than 100 ppm. Position of the probe 28 is controlled to be at a desired location in the uniform space F by a positioning device 30 disposed on the pole piece 108b. Based on a detection signal from the probe 28, a tesla-meter 32 measures a magnetic field strength and gives the measurement value to the CPU 14. Alternatively to the NMR element, the magnetic field strength may be measured by a Hall element.

Further, the CPU 14 is linked with a temperature controller 34. The temperature controller 34 is constantly monitored by the computer 12. The temperature controller 34 controls a heater 38 based on data from a temperature sensor 36 disposed in the magnetic field generator 100. If the temperature of the magnetic field generator 100 decreases, magnetic flux generated from the permanent magnet groups 106a, 106b and other magnets increases. This destabilizes the magnetic field, making impossible to perform accurate adjustment of the magnetic field. In order to avoid this, the heater 38 provided in the magnetic field generator 100 is controlled by the temperature controller 34, and the temperature of the magnetic field generator 100 is maintained at a constant temperature.

Based on calculation results obtained from the magnetic field adjusting apparatus 10 described above, a passive shimming is performed by bonding magnetic field adjusting pieces (hereinafter called "adjusting pieces") 40 made of a magnet onto the silicon steel plate 112, whereby fine tuning of the magnetic field is achieved.

Figure 2B:
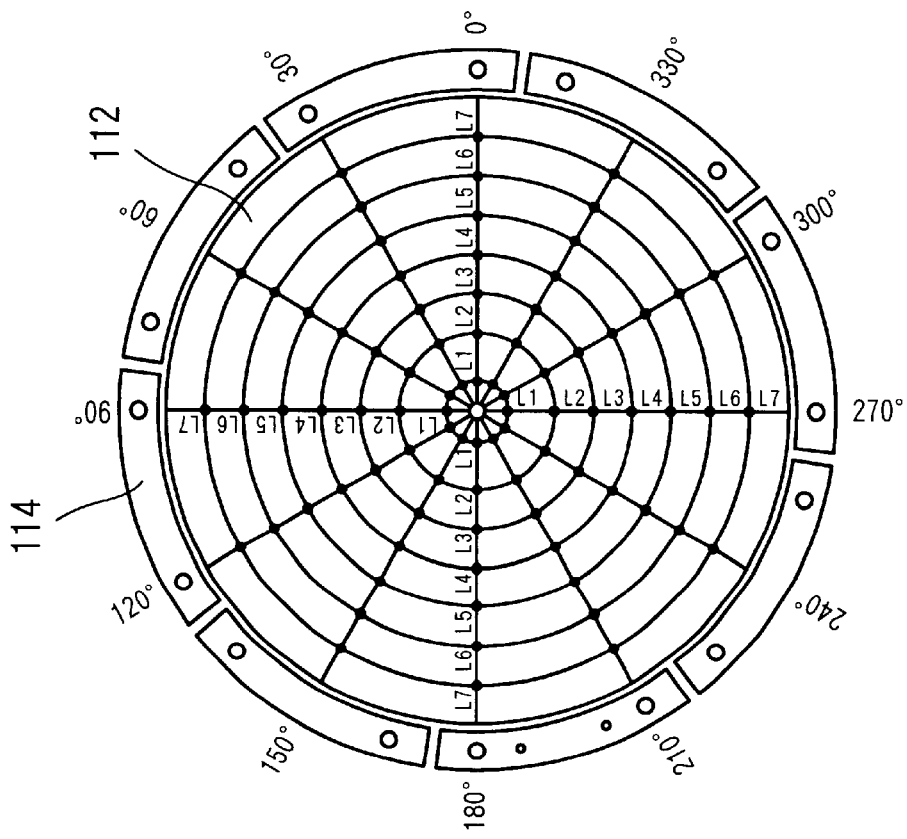
FIG. 2A and FIG. 2B are charts each showing locations at which a magnetic field adjusting piece is to be bonded.
Figure 2A:
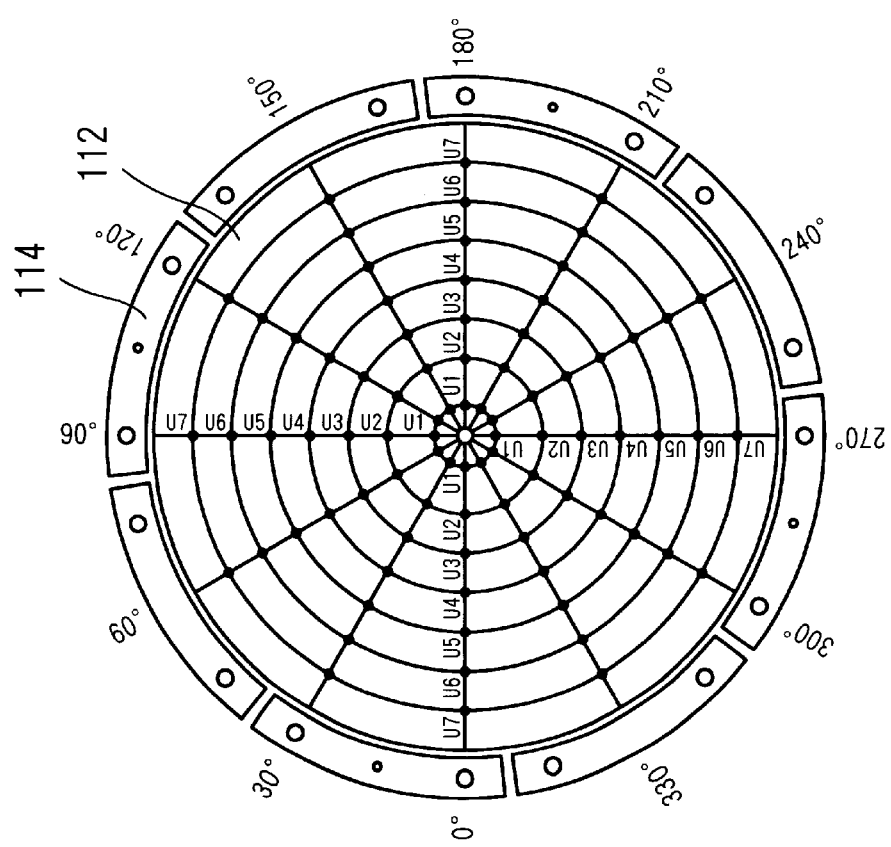

The placing locations are defined, as shown in FIG. 2A and FIG. 2B, on intersections made by radial lines and centric circles. The radial lines divide an area on the silicone steel plate 112 enclosed by the annular projection 114 at every 30 degrees. The centric circles are drawn from the center of the radial lines. Specifically, on each of the main surfaces of the respective silicon steel plates 112 of the upper and the lower pole pieces 108a, 108b, as shown in FIG. 2A and FIG. 2B respectively, there are defined seven radial locations (U1 through U7 on the pole piece 108a and L1 through L7 on the pole piece 108b) multiplied by twelve circumferential locations (0 degree through 330 degrees), or a total of 84 locations are available as the placing locations. At other locations, adjusting pieces are bonded at the factory before shipment in order to adjust the magnetic field strength in advance. When the adjusting pieces are bonded in an on-site adjustment, usually, it is not that adjusting pieces of any desired size is prepared on the site, but adjusting pieces of several predetermined sizes are used. The sizes of the adjusting pieces 40 to be used are predetermined in accordance with the placing location and size data is stored in the computer 12. Specifically, the adjusting piece 40 having a 4 mm diameter is used at locations on radii U1, U2 and L1, L2. Likewise, a 7 mm diameter piece is placed on radii U3, U4 and L3, L4, whereas an 11 mm diameter piece is placed on radii U5 through U7 and L5 through L7. Each of the adjusting pieces is disc-shaped sintered anisotropic neodymium magnet having a thickness of 1 mm.

Next, a principle of linear programming as referred to in this specification will be described.

The linear programming is a technique of maximizing or minimizing an object function under a given condition, and is a kind of optimization method. A setting for a method of identifying the locations and the number of the adjusting pieces 40 can be given by the following expressions:

Constraint equations are given as Expression 1

$$-e/2 \leq a_{11}x_1+a_{12}x_2+a_{13}x_3+ \ldots +a_{1n}x_n+b_1 \leq e/2$$
$$-e/2 \leq a_{21}x_1+a_{22}x_2+a_{23}x_3+ \ldots +a_{2n}x_n+b_2 \leq e/2$$
$$\ldots \ldots \ldots \ldots$$
$$\ldots \ldots \ldots \ldots$$
$$-e/2 \leq a_{m1}x_1+a_{m2}x_2+a_{m3}x_3+ \ldots +a_{mn}x_m+b_m \leq e/2 \quad \text{(Expression 1)}$$
$$-P_{a1} \leq x_1 \leq p_{b1}$$
$$-P_{a2} \leq x_2 \leq p_{b2}$$
$$-P_{a3} \leq x_3 \leq p_{b3}$$
$$\ldots \ldots \ldots \ldots$$
$$\ldots \ldots \ldots \ldots$$
$$-P_{an} \leq x_n \leq p_{bn}$$

where
- m: the total number of magnetic field measurement positions
- n: the total number of locations of the adjusting pieces
- e: target value for magnetic field uniformity
- $b_1$: magnetic field strength at a magnetic field measurement position i
- $a_{ij}$: amount of magnetic field change caused to the magnetic field at the position i by an adjusting piece j
- $x_j$: the number of the adjusting pieces
- $p_{ai}$: lower limit to the number of the adjusting pieces mountable to the location j
- $P_{bi}$: upper limit to the number of the adjusting pieces mountable to the location j Expression 1 is expressed in matrix format as Expression 2.

$$[-E/2] \leq [A][X]+[B] \leq [E/2]$$
$$[-_a] \leq [X] \leq [P_b] \quad \text{(Expression 2)}$$

Under these constraint equations, an objective function shown in Expression 3 is defined and search is made for [X] that minimizes z, x is absolute value, according to the present optimization method.

$$x_1+x_2+x_3+ \ldots +x=z \rightarrow \text{minimize} \quad \text{(Expression 3)}$$

In other words, the present method is a method of adding the adjusting pieces 40 to the magnetic field distribution [B], and obtaining the smallest [X] that finally gives the target value [E] of the magnetic field uniformity. It should be noted that [A] must be calculated or measured and an obtained matrix must be stored in advance, and a specific value must be given for the target e when performing the calculation.

According to the present linear programming method, as is clear from Expression. 2, the number [X] of the adjusting pieces 40 will be very much influenced by a value given to the target value e of the magnetic field uniformity. For example, if a very small value is selected for the target e in an attempt to get a very high magnetic field uniformity, sometimes, an extremely big value is given for the number of the adjusting pieces 40. So, it is usual that a value for the target e is selected appropriately while monitoring the number of the adjusting pieces 40 given by the calculation.

The linear programming is advantageous in that the number of the adjusting pieces 40 as a solution is usually smaller than by other methods, by definition, although the given solution for the number of the adjusting pieces 40 can be decimal.

Next, a principle of direct search as referred to in this specification will be described.

As a starting assumption, the locations at which the adjusting pieces 40 can be placed are predetermined. Then, another assumption is set that at any of the locations, only one adjusting piece 40 will be positioned at a time. Under these conditions, the magnetic field distribution [B'] as after the placement of the adjusting piece 40 is estimated by using an equation [A][X]+[B]=[B'], and only one adjusting piece 40 that will give the best magnetic field distribution is selected. Next, the above cycle of operations is repeated for [B'] until a single adjusting piece 40 that will give the best [A][X]+[B'] is selected, and this particular adjusting piece 40 is selected. By repeating such a procedure, a magnetic field of a high uniformity is obtained. The calculation is ceased at a point when placement of the adjusting piece 40 at any location gives no more improvement in the magnetic field uniformity.

The direct search does not give a decimal answer by definition. This eliminates laborious steps that are otherwise necessary for mathematical programming, i.e. rounding up the given number of the adjusting pieces, obtaining and comparing a magnetic field uniformity based on the rounded number with the target value. Therefore, the magnetic field uniformity can be improved easily.

Further, if the linear programming and the direct search are combined, it becomes possible to obtain a very good magnetic field uniformity with a small number of adjusting pieces 40.

Now with reference to FIG. 3 through FIG. 5, a magnetic field adjusting operation using the magnetic field adjusting apparatus 10 will be described.

When the magnetic field generator 10 arrives at a site of installation such as a hospital, a worker (field engineer) places the computer 12 at a place not affected by magnetism. The temperature controller 34 maintains the magnetic field generator 100 at a constant temperature, so that center magnetic field strength is stabilized.

Then, in order to check if the center magnetic field strength has been stabilized, the following procedure is performed.

First, the process checks if a predetermined amount of time (10 minutes for example) has been passed (Step S1). The process waits until the predetermined time is passed. After the lapse of the predetermined time, a reading of a center magnetic field strength is stored in the RAM 22 (Step S3). Next, comparison is made between the last value and the current value of the center magnetic field strength, to see if the difference between the two is within a predetermined value (20 ppm for example) (Step S5). If the difference in magnetic field strength exceeds the predetermined value, the process goes back to Step S1, and the above cycle is repeated until the difference has come within the predetermined value.

When the difference in magnetic field strength has come within the predetermined value, the process determines that the center magnetic field strength has stabilized, and measures a magnetic field strength for the shimming. Specifically, the probe 28 is turned around and moved, and the tesla-meter 32 measures a magnetic field strength at 130 through 180 positions on the sphere of the uniform space F. Based on these measurements, a magnetic field uniformity Z is calculated (Step S7). The measured values of the magnetic field strength and the calculated magnetic field uniformity value Z are stored in the RAM 22 of the computer 12 (Step S9).

Then, a calculation condition file is loaded from the hard disk drive 16 and/or the floppy disk drive 18 onto the RAM 22 (Step S11). The calculation condition file contains a database on the adjusting pieces 40, which contains for example an amount of change in magnetic field for each placing location on the surface of pole pieces 108a, 108b, namely, how much change will be expected at each of the measurement positions on and in the sphere of the uniform space F by a placement of the adjusting piece 40 at each of the placing locations. Other data loaded are magnetic field uniformity specifications A ppm, threshold values B ppm for checking whether or not the linear programming should be performed, and magnetic field uniformity target values e(I), and so on. The target values e(I) includes as many as N values that satisfy: $e(1)>e(2)>\ldots>e(N)$, where I is an integer that satisfies: $1 \leq I \leq N$. Further, there is a condition: the target value e(I) <specification A<threshold B. A note should be made here that in general, the smaller the magnetic field uniformity target value e (I) is, the more demanding the correction will be, a greater number of adjusting pieces 40 will be needed, and complex work will be required. Therefore, desired accuracy in the magnetic field uniformity must be negotiated with the necessary amount of correction work, based on which magnetic field uniformity target values e(I) should be set. Further, the process also loads an upper limit (maximum number) M to the total adjusting pieces 40 which can be bonded, and an upper limit (maximum number) P to the adjusting pieces 40 which can be bonded at one location.

Then, calculation is made for a difference between the maximum value and the minimum value of the target values e(I), or the width Δd (Step S13), and the process checks if this is going to be the first passive shimming, i.e. if the magnetic field generator has ever received a magnetic field correction by means of the adjusting pieces 40 (Step S15). This step is necessary because for the magnetic field generator which has already the adjustment piece(s) 40 bonded, the locations and the number of the adjustment pieces should be taken into account. If the current adjustment is not the first passive shimming, then the locations, the number and so on of the adjusting pieces 40 which are already bonded are entered to the RAM 22 (Step S17), and the process goes to Step S19 shown in FIG. 4. If the current adjustment is the first passive shimming, the process goes directly to Step S19.

In Step S19, the current magnetic field uniformity Z is compared with the specification A and the threshold B.

If $Z \geq B$, then the following setting is made: Target=e(I), in which as many as N preloaded values are selected as the target values e(I) (Step S21). Then, sequentially from the largest target value e(1), the process applies the linear programming and calculates the locations and the number of the adjusting pieces 40 (Step S23). In this process, if the number of the adjusting pieces 40 is given as a decimal number, then the process rounds the number into an integer, and based on the locations and the number of the adjusting pieces 40 after the rounding, the process calculates an expected magnetic field uniformity for Target=e(I) (Step S25).

After the calculation, the process checks if the given total number of the adjusting pieces is not greater than M and if the number of adjusting pieces assigned to any of the locations is not greater than P (Step S27). Example settings are M=50, and P=10.

If the total number of the adjusting pieces exceeds M or the number of the adjusting pieces for any location is greater than P, the process further checks if I=1 (Step S29). If I=1, the process determines that the result of the calculation cannot satisfy any of the current N target values e(I), and then increases the target value by using the formula e(I)=e(I)+Δd (Step S31), and goes back to Step S21. If I>1, then the process goes to Step S33.

On the other hand, if Step S27 finds that the total number of the adjusting pieces is not greater than M and the number of the adjusting pieces assigned to any of the locations is not greater than P, then the locations and the number of adjusting pieces 40, and the expected magnetic field uniformity for this particular target value e(I) are stored (Step S35).

Then, the process checks if I=N (Step S37). If I=N is not satisfied, then I is incremented by using the formula I=I+1 (Step S39), and the process goes back to Step S21.

If I=N, this means that the calculation for all of the N current target values e(I) has been completed and the calculated locations and the number of adjusting pieces 40 and the expected magnetic field uniformity have been stored for each of the target values e(I). At this point, the process makes the following setting: the value of I=1 (Step S41), then reduces the target value by using the formula e(I)=e(I)−Δd (Step S43), and goes back to Step S21.

After cycles of the steps described above, Step S33 is performed, where e(I) that minimizes (the number of the adjusting pieces)$^2$+(expected magnetic field uniformity)$^2$ is selected as e(opt), and the process makes a setting: Target=e(opt). As has been described, from solutions given for the target values e(I), the process selects an optimum solution that will improve the magnetic field uniformity with a small number of the adjusting pieces 40, and improves adjusting accuracy.

For the selected Target=e(opt), the process picks up the locations and the number of adjusting pieces 40 and the expected magnetic field uniformity. For this particular target value, an expected magnetic field strength at each of the measurement positions on the sphere of the uniform space F is stored in the RAM 22 (Step S45).

The process checks if the expected magnetic field uniformity is not greater than the specification A (Step S47). If the expected magnetic field uniformity is not greater than the specification A, the result is displayed in the display portion 26 of the computer 12 (Step S51), and the process ends. On the other hand, if the expected magnetic field uniformity is greater than the specification A, the direct search shown in FIG. 5 is performed (Step S49), and a result is displayed in the display portion 26 of the computer 12 (Step S51), and then the process ends. The display portion 26 displays adjustment data as shown in FIG. 6A through FIG. 6D, FIG. 7A through FIG. 7D, and FIG. 8A through FIG. 8D. The worker should simply dispose the adjusting pieces 40 on the silicon steel plate 112, following the display. Therefore, the magnetic field adjustment can be achieved easily and accurately.

If Step S19 finds that the magnetic field uniformity Z is greater than the specification A and smaller than the threshold B, then the calculation by the linear programming method is not performed, and the process goes directly to Step S49. If the magnetic field uniformity Z is not greater than the specification A, then the process goes directly to the end.

Figure 5:
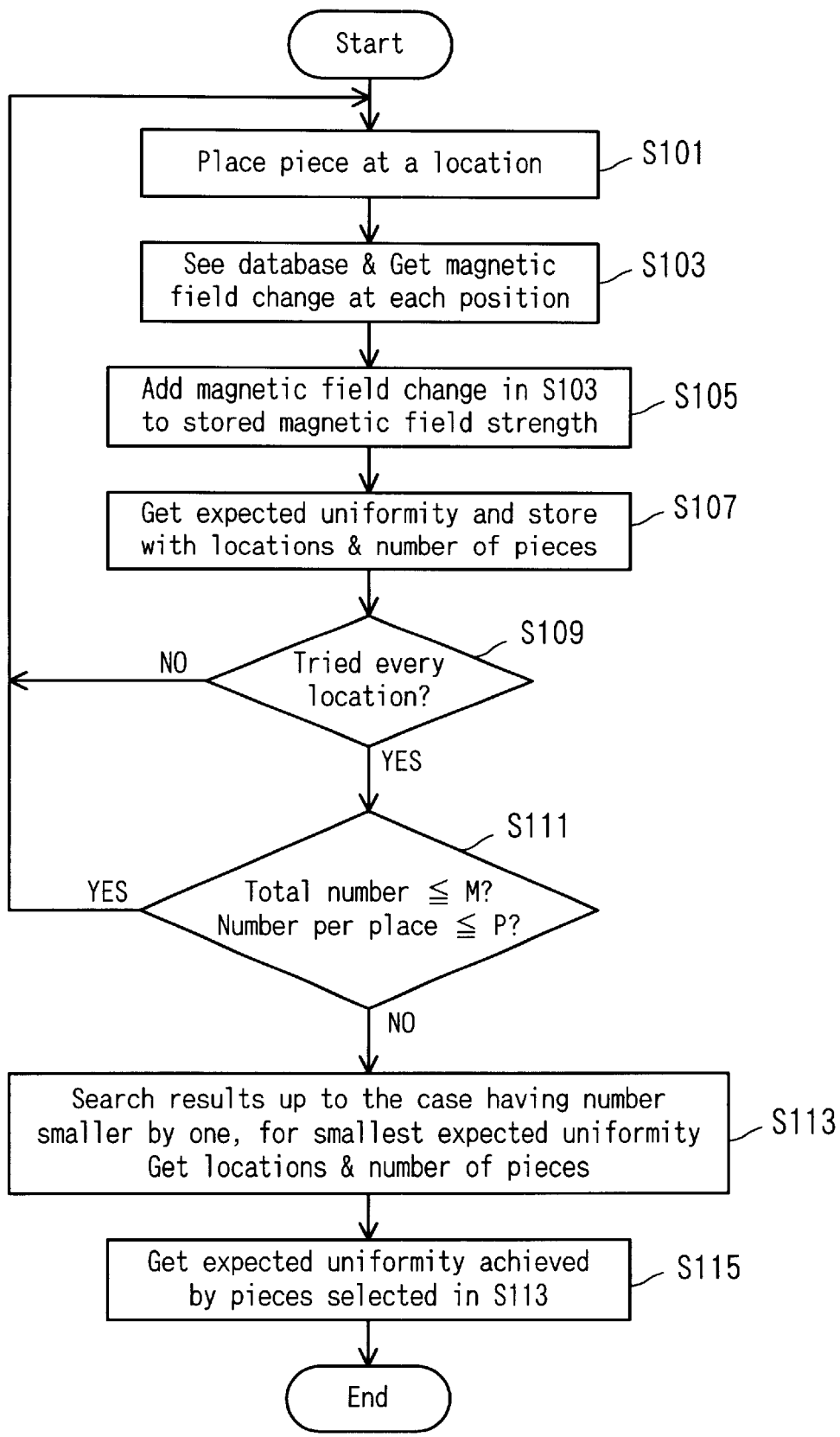
FIG. 5 is a flowchart showing an operation example according to a direct search.

With reference to FIG. 5, description will be made for processing steps of the direct search.

First, one adjusting piece 40 is hypothetically placed at a certain location (Radius L1, Angle 0 degree, for example) (Step S101). With reference to the data base, the process calculates an amount of change in the magnetic field at each of the measurement positions of the uniform space F (Step S103).

Next, the amount of change in the magnetic field calculated in Step S103 is added to the stored magnetic field strength, for each of the measurement positions (Step S105). If the calculation by the linear programming has not been made, the addition of the calculated amount of change in the magnetic field is made to the magnetic field strength values loaded in Step S9. On the other hand, if the calculation by the linear programming has been made, the addition is made to the expected magnetic field strength values stored in Step S45.

Then, based on the result of calculation in Step S105, an expected magnetic field uniformity is calculated and stored in the RAM 22, together with the locations and the number of adjusting pieces 40 (Step S107).

The process checks if it has disposed the adjusting piece 40 at every location shown in FIG. 2, or in other words, the process checks if it has calculated a data as after the correction for each of the locations (Step S109). If the data as after the correction has not yet been calculated for all of the placing locations (i.e. from Radius L1, Angle 0 degree through Radius U7, Angle 330 degrees), then the calculation process with the hypothetical placement of the adjusting piece 40 at each of the remaining locations is performed. When the data as after the correction has been calculated for all of the placing locations, the process checks if the given total number of the adjusting pieces is not greater than M and if the number of adjusting pieces assigned to any of the locations is not greater than P (Step Sill).

As long as the total number of the adjusting pieces is not greater than M and the number for any of the locations is not greater than P, the process goes back to Step S101, add another adjusting piece 40 to a certain location, and repeats the above described cycle of direct search.

When the total number of the adjusting pieces exceeds M or the number of the adjusting pieces at any of the locations exceeds P, the process searches the calculation results obtained up to the case in which the currently exceeding number was smaller by one, for the smallest value of the expected magnetic field uniformity, and locations and the number of the adjusting pieces 40 for this particular case (Step S113). Thus, the expected magnetic field uniformity in this case is obtained (Step S115). The process then goes to Step S51 in FIG. 4, where adjustment data including the locations and the number of the adjusting pieces 40 are displayed in the display portion 26, and the process ends.

As described, the process checks an effect on the magnetic field in the space 102 by placing more than one adjusting pieces 40, and selects the locations and the number of the adjusting pieces 40 that will contribute most to the improvement in the magnetic field uniformity. This method can reduce the number of repeated measurements, making possible to improve the magnetic field uniformity in a short time.

Further, by setting an upper limit to the number of the allocatable adjusting pieces 40, magnetic field can be adjusted with a fewer adjusting pieces 40.

Further, since the adjusting piece 40 is disposed on the silicon steel plate 112, the amount of magnetic field change per adjusting piece can be set to a small value, making easy to perform fine adjustment of the magnetic field.

Further, since the adjusting piece 40 is a magnet, the magnetic field can be adjusted in both of the positive and the negative directions, making possible to perform the magnetic field adjustment more flexibly.

Next, examples of the adjustment data (calculation results) shown in the display portion 26 are shown in FIG. 6A through FIG. 6D, FIG. 7A through FIG. 7D, and FIG. 8A through FIG. 8D.

FIG. 6A through FIG. 6D show adjustment data according to the linear programming (LP), FIG. 7A through FIG. 7D show data according to the direct search (DS), and FIG. 8A through FIG. 8D show data according to the combination of the linear programming and the direct search (LP+DS).

In FIG. 6A, FIG. 7A and FIG. 8A, the column "Measured homogeneity in PPM" shows the magnetic field uniformity before the correction (45.1 ppm in this example), "Calculated PPM (LP Unrounded)" shows the expected magnetic field uniformity before rounding, obtained by the linear programming, "Calculated PPM (LP Rounded)" shows the expected magnetic field uniformity after rounding, obtained by the linear programming, and "Calculated PPM (DS added)" shows the expected magnetic field uniformity by the direct search. The magnetic field uniformity can be obtained by the formula (Magnetic field strength maximum value—Magnetic field strength minimum value)×$10^6$/(Center magnetic field strength or Average magnetic field strength), and a smaller value indicates a higher magnetic field uniformity.

Tables shown in FIG. 6B, FIG. 7B and FIG. 8B give such information as the size of the adjusting piece 40 (labeled i"Shim"), the placing location for the adjusting piece 40, the number of the adjusting pieces 40 to be bonded at each location (Delta), the number of the adjusting pieces 40 bonded currently (Current), and a sum of the two categories (Total). Note that the number of the adjusting pieces 40 given as a decimal figure is rounded into an integer and the integer after the rounding is displayed in the tables shown in FIG. 6B, FIG. 7B and FIG. 8B.

Tables shown in FIG. 6C, FIG. 7C and FIG. 8C give the number of the adjusting pieces 40, as before the rounding, for each of the placing locations on the upper pole piece 108a. Tables shown in FIG. 6D, FIG. 7D and FIG. 8D give the number of the adjusting pieces 40, as before the rounding, for each of the placing locations on the lower pole piece 108b. A negative value in these tables indicates that the adjusting piece 40 should be bonded so that the magnetized direction of the adjusting piece 40 is against the direction of magnetic flux generated by the magnetic field generator 10 (in the repelling direction).

As understood from FIG. 6A through FIG. 6D, by first setting target values and calculating by the linear programming, magnetic field adjustment becomes possible with fewer adjusting pieces 40, and the expected magnetic field uniformity can be reduced to 35.8 ppm.

As understood from FIG. 7A through FIG. 7D, through calculation by the direct search, the expected magnetic field uniformity can be reduced to 41.4 ppm.

As understood from FIG. 8A through FIG. 8D, by combining the linear programming and the direct search, magnetic field adjustment can be performed more effectively with a fewer adjusting pieces than in the single use of the direct search, and the expected magnetic field uniformity can be reduced to 26.1 ppm.

As has been exemplified, magnetic field adjustment can be performed accurately with the adjusting pieces 40 of a few different sizes.

The present invention is particularly effective to an open type apparatus such as the magnetic field generator 10 in which the magnetic field uniformity can be easily deteriorated during transportation. The open type apparatus is a magnetic field generator having a continuous open space as wide as not smaller than 150 degrees.

In FIG. 6C, FIG. 6D, FIG. 7C, FIG. 7D, FIG. 8C and FIG. 8D, the number of adjusting pieces is given in decimal form for convenience of description. However, display may be more worker friendly. For example, display may be accompanied by polarity indication by "N" and "S", or color coding may be used in the display. Calculation results may be printed by a printer, or may be outputted by any other outputting means.

The worker may be allowed to choose which method should be used for the magnetic field adjustment among the linear programming, the direct search and the combination of both.

According to the above embodiment, scope of operation is the magnetic field adjustment by means of bonding the adjusting piece 40 onto the pole pieces 108a, 108b. Alternatively however, the scope of the adjustment may also include more major magnetic field adjustment such as by means of the movable yokes 116a, 116b, the adjusting bolts 122a, 122b and the gap adjusting bolt 127.

Further, according to the above embodiment, description is made on the premise that the adjusting piece 40 is bonded directly onto the silicone steel plate 112. However, the present invention is also applicable to a case in which an magnetic field adjusting board (passive board)(disclosed in U.S. Pat. No. 6,275,128 B1) dedicated to on-site adjustment is provided separately from the silicon steel plate 112, and the adjusting piece 40 is bonded to the adjusting board.

Figure 3:
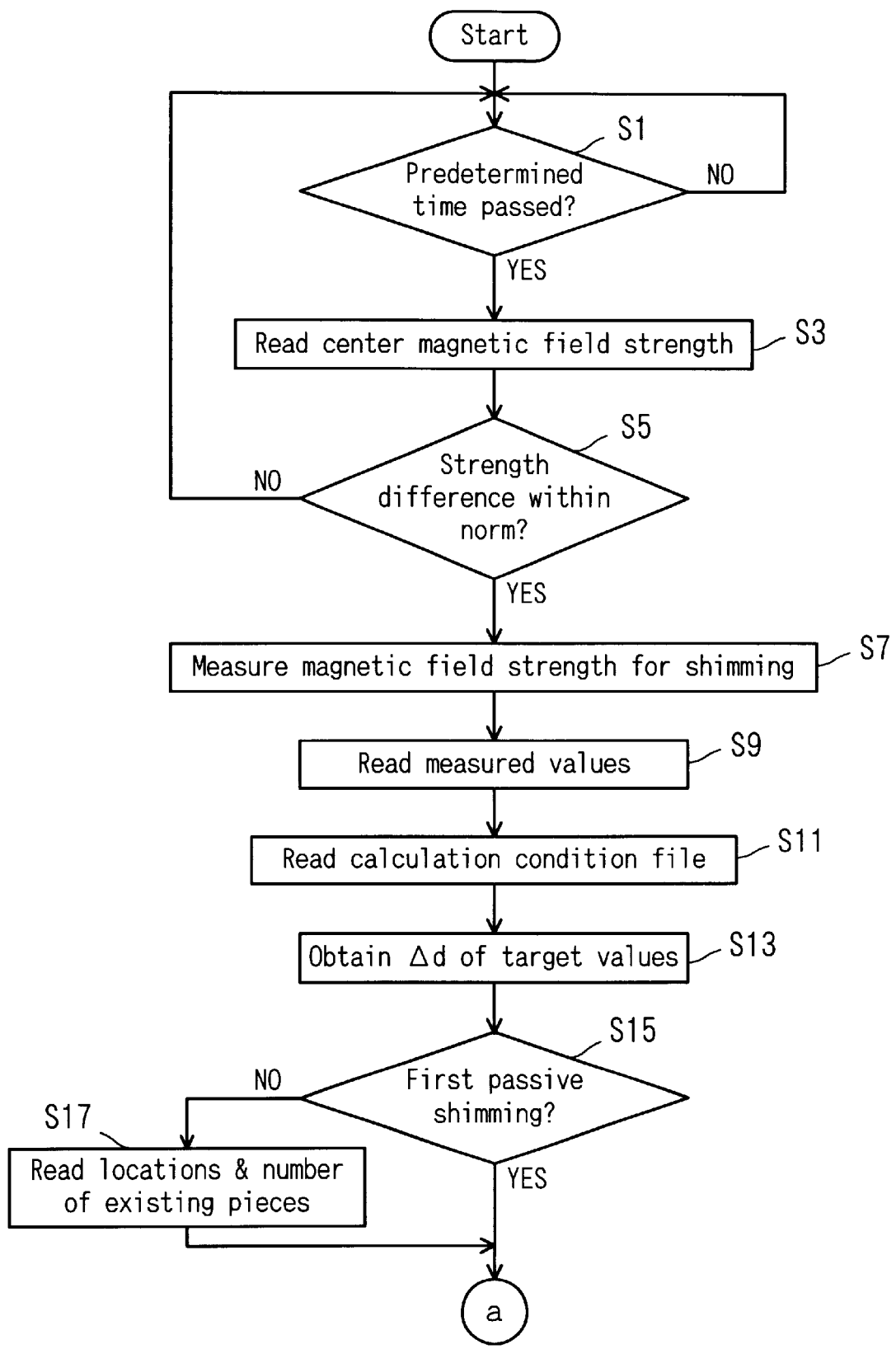
FIG. 3 is a flowchart showing an operation example of the present invention.
Figure 4:
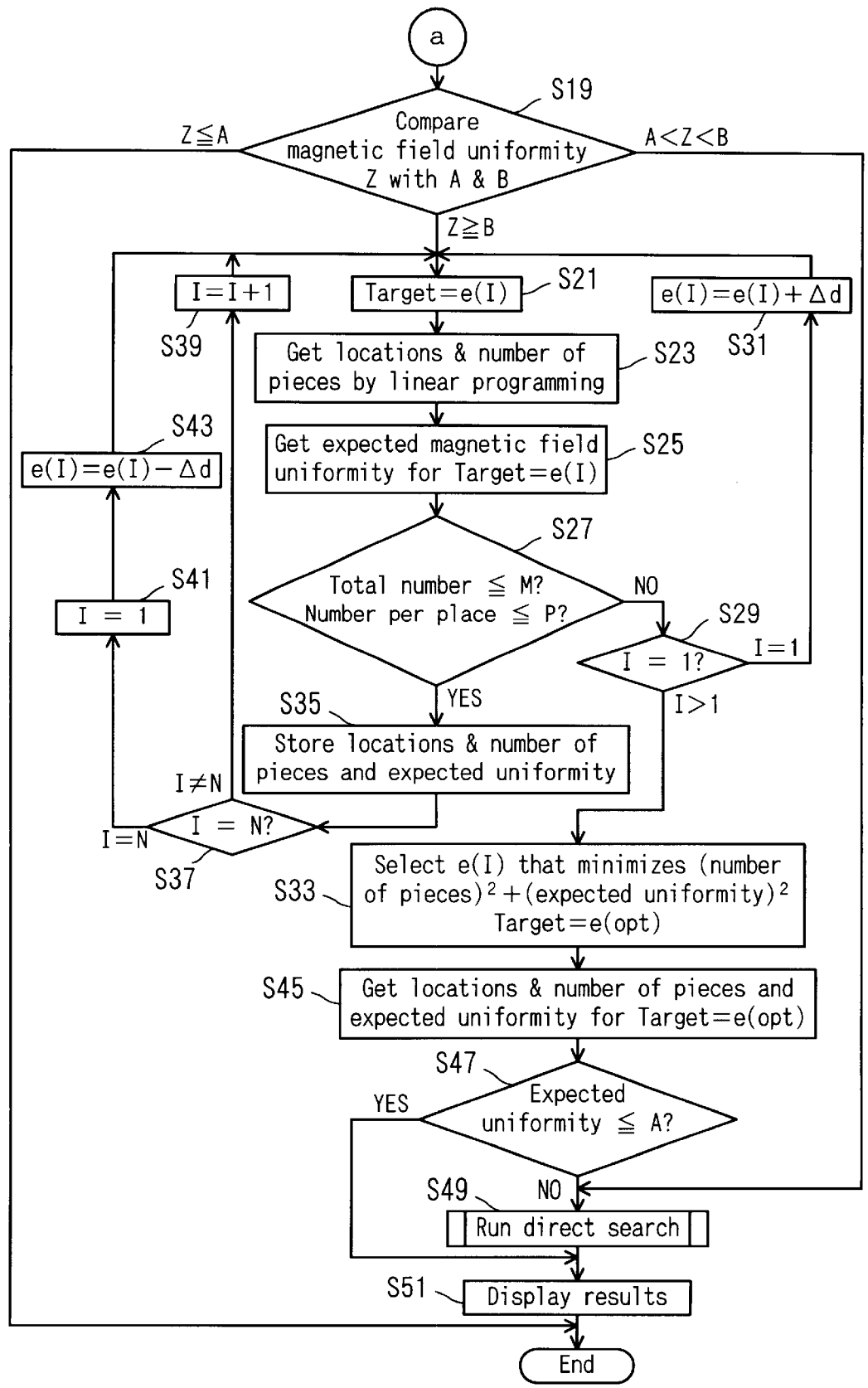
FIG. 4 is a flowchart showing the operation continued from FIG. 3.

Further, the program for performing the steps of operation shown in FIG. 3 through FIG. 5 may be stored in a floppy disk or a CD-ROM. In this case, the program can be run by the computer 12 through the floppy disk drive 18 and the CD-ROM drive 19 respectively. Further, the program may be downloaded through Internet and so on, and run by the computer 12.

The present invention being thus far described and illustrated in detail, it is obvious that these description and drawings only represent an example of the present invention, and should not be interpreted as limiting the invention. The spirit and scope of the present invention is only limited by words used in the accompanied claims.

What is claimed is:

1. A magnet field adjusting apparatus for adjusting a magnetic field of a space in a magnetic field generator including a pair of plate yokes opposed to each other and a permanent magnet disposed on an opposed surface of each plate yoke, comprising:

means for measuring a magnetic field strength at a predetermined position in the space;

means for storing in memory an amount of change in the magnetic field caused by placement of a magnetic field adjusting piece at a predetermined location of the magnetic field generator;

means for inputting a target value for a magnetic uniformity;

means for calculating a location and the number of the magnetic field adjusting pieces based on the magnetic field strength, the amount of change in the magnetic field and the target value;

means for calculating a value corresponding to an expected magnetic field uniformity based on the location and the number of the magnetic field adjusting pieces; and means for outputting the location and the number of the magnetic field adjusting pieces if the value corresponding to the expected magnetic field uniformity is not greater than a predetermined value.

2. The apparatus according to claim 1, further comprising;

means for calculating, if the value corresponding to the expected magnetic field uniformity is greater than the predetermined value, a value corresponding to an expected magnetic field uniformity expected by further placement of the magnetic field adjusting piece at a predetermined location of the magnetic field generator, for each placement of the magnetic field adjusting piece; and means for outputting a location and the number of the magnetic field adjusting pieces that minimize the value corresponding to the expected magnetic field uniformity.

3. A magnetic field adjusting apparatus for adjusting a magnetic field of a space in a magnetic field generator including a pair of plate yokes opposed to each other and a permanent magnet disposed on an opposed surface of each plate yoke, comprising:

means for measuring a magnetic field strength at a predetermined position in the space;

means for storing in memory an amount of change in the magnetic field caused by placement of a magnetic field adjusting piece at a predetermined location of the magnetic field generator;

means for calculating a value corresponding to an expected magnetic field uniformity expected by placement of the magnetic field adjusting piece at a predetermined location of the magnetic field generator, based on the magnetic field strength and the amount of change in the magnetic field, for each placement of the magnetic field adjusting piece; and means for outputting a location and the number of the magnetic field adjusting pieces that minimize the value corresponding to the expected magnetic field uniformity.

4. A magnetic field adjusting method for adjusting a magnetic field of a space in a magnetic field generator including a pair of plate yokes opposed to each other and a permanent magnetic field generator including a pair of plate yokes opposed to each other and a permanent magnet disposed on an opposed surface of each plate yoke, comprising:

- a step (a) of measuring a magnetic field strength at a predetermined position in the space;
- a step (b) of storing in memory an amount of change in the magnetic field caused by placement of a magnetic field adjusting piece at a predetermined location of the magnetic field generator;
- a step (c) of inputting a target value for a magnetic field uniformity;
- a step (d) of calculating a location and the number of the magnetic field adjusting pieces based on the magnetic field strength, the amount of change in the magnetic field and the target value;
- a step (e) of calculating a value corresponding to an expected magnetic field uniformity based on the location and the number of the magnetic field adjusting pieces;
- a step (f) of outputting the location and the number of the magnetic field adjusting pieces if the value corresponding to the expected magnetic field uniformity is not greater than a predetermined value; and
- a step (g) of disposing the magnetic field adjusting piece on the magnetic field generator based on the outputted location and the number of the magnetic field adjusting pieces.

5. The method according to claim 4, further comprising step of checking if the number of the magnetic field adjusting pieces calculated in the step (d) is not greater than an upper limit or not, wherein the value corresponding to the expected magnetic field uniformity expected for the number of the magnetic field adjusting pieces not greater than the upper limit is compared with the predetermined value, in the step (f).

6. The method according to claim 4, further comprising:

- a step of calculating, if the value corresponding to an expected magnetic field uniformity is greater than the predetermined value, a value corresponding to an expected magnetic field uniformity is greater than the predetermined value, a value corresponding to an expected magnetic field uniformity expected by further placement of the magnetic field adjusting pieced at a predetermined location of the magnetic field generator, for each placement of the magnetic field adjusting piece;
- a step of outputting a location and the number of the magnetic field adjusting pieces that minimize the value corresponding to the expected magnetic field uniformity; and
- a step of disposing the magnetic field adjusting piece on the magnetic field generator based on the outputted location and the number of the magnetic field adjusting pieces.

7. A magnetic field adjusting method for adjusting a magnetic field of a space in a magnetic field generator including a pair of plate yokes opposed to each other and a permanent magnet disposed on an opposed surface of each plate yoke, comprising:

- a step (a) of measuring a magnetic field s o at a predetermined position in the space;
- a step (b) of storing in memory an amount of change in the magnetic field caused by placement of a magnetic field adjusting piece at a predetermined location of the magnetic field generator;
- a step (c) of calculating a value corresponding to an expected magnetic field uniformity expected by placement of the magnetic field adjusting piece at a predetermined location of the magnetic field generator, based on the magnetic field strength and the amount of change in the magnetic field, for each placement of the magnetic field adjusting piece;
- a step (d) of outputting a location and the number of magnetic field adjusting pieces that minimize the value corresponding to the expected magnetic field uniformity; and
- a step (e) of disposing the magnetic field adjusting piece on the magnetic field generator based on the outputted location and the number of the magnetic field adjusting pieces.

8. The method according to claim 7, further comprising:

- a step of checking if the number of the magnetic field adjusting pieces placed on the magnetic field generator in the step (c) is not greater than an upper limit on not,
- wherein, if the number of the magnetic field adjusting pieces is not greater than the upper limit, the location and the number of the magnetic field adjusting pieces that minimize the value corresponding to the expected magnetic field uniformity are outputted, in the step (d).

9. The method according to claim 4 or 7, wherein a silicon steel plate is provided on the permanent magnet, placement of the magnetic field adjusting piece being made on the silicon steel plate.

10. The method according to claim 4 or 7, wherein the magnetic field adjusting piece is provided by a magnet.

11. A computer-readable recording medium containing a program for adjusting a magnetic field of a space in a magnetic field generator including a pair of plate of yokes opposed to each other and a permanent magnet disposed on an opposed surface of each plate yoke, the program being executable by a computer and comprising:

- a step of inputting a magnetic field strength at a predetermined position in the space;
- a step of storing in memory an amount of change in the magnetic field caused by placement of a magnetic field adjusting piece at a predetermined location of the magnetic field generator;
- a step of inputting a target value for a magnetic field uniformity;
- a step of calculating a location and the number of the magnetic field adjusting pieces based on the magnetic field strength, the amount of change in the magnetic field and the target value;
- a step of calculating a value corresponding to an expected magnetic field uniformity based on the location and the number of the magnetic field adjusting pieces; and
- a step of outputting the location and the number of the magnetic field adjusting pieces if the value corresponding to the expected magnetic field uniformity is not greater than a predetermined value.

12. The medium according to claim 11, the program further comprising:

- a step of calculating, if the value corresponding to the expected magnetic field uniformity is greater than the predetermined value, a value corresponding to an expected magnetic field uniformity expected by further placement of the magnetic field adjusting piece at a predetermined location of the magnetic field generator, for each placement of the magnetic field adjusting piece; and a step of outputting a location and the number of the magnetic field adjusting pieces that minimize the value corresponding to the expected magnetic field uniformity.

13. A computer-readable recording medium containing a program for adjusting a magnetic field of a space in a magnetic field generator including a pair of plate yokes opposed to each other and a permanent magnet disposed on an opposed surface of each plate yoke, the program being executable by a computer and comprising:

a step of inputting a magnetic field strength at a predetermined position in the space;

a step of storing in memory an amount of change in the magnetic field caused by placement of a magnetic field adjusting piece at a predetermined location of the magnetic field generator;

a step of calculating a value corresponding to an expected magnetic field uniformity expected by placement of the magnetic field adjusting piece at a predetermined location of the magnetic field generator, based on the magnetic field strength and the amount of change in the magnetic field, for each placement of the magnetic field adjusting piece; and a step of outputting a location and the number of the magnetic field adjusting pieces that minimize the value corresponding to the expected magnetic field uniformity.

* * * * *